United States Patent
Tanzawa et al.

(10) Patent No.: US 6,222,774 B1
(45) Date of Patent: *Apr. 24, 2001

(54) DATA-ERASABLE NON-VOLATILE SEMICONDUCTOR MEMORY DEVICE

(75) Inventors: Toru Tanzawa, Ebina; Akira Umezawa, Yokohama; Tadayuki Taura, Zushi; Shigeru Atsumi, Yokohama, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,180

(22) Filed: Sep. 8, 1999

(30) Foreign Application Priority Data

Sep. 8, 1998 (JP) .................................................. 10-253992

(51) Int. Cl.[7] .................................................. G11C 16/06
(52) U.S. Cl. .................................... 365/185.29; 365/185.2
(58) Field of Search .......................... 365/185.05, 185.11, 365/185.17, 185.18, 185.2, 185.27, 185.29, 185.33, 218

(56) References Cited

U.S. PATENT DOCUMENTS 5,590,073 * 12/1996 Arakawa et al. ................ 365/185.33
5,822,248 * 10/1998 Satori et al. ..................... 365/185.11
5,959,884 *  9/1999 Chevallier et al. ............. 365/185.33

OTHER PUBLICATIONS

IEEE Journal of Solid–State Circuits, vol. 26, No. 4, Apr. 1991, Masaki Momodomi et al.
IEEE Journal of Solid–State Circuits, vol. 27, No. 11, Nov. 1992, Toshikatsu Jinbo et al.

* cited by examiner

Primary Examiner—Trong Phan
(74) Attorney, Agent, or Firm—Banner & Witcoff, Ltd.

(57) ABSTRACT

The non-volatile semiconductor memory device comprises memory cell array having a plurality of memory cells, word lines connected to control gates of the memory cells, bit lines connected to drains of the memory cells, a source line connected in common to sources of the memory cells and connected to a well region where the memory cells are formed, a row decoder consisting of a row main decoder and a row sub-decoder for selecting a word line in the memory cell array, a column gate circuits for selecting a bit line in the memory cell array, a control gate driver for biasing a word line in the memory cell array, and an well driver for biasing semiconductor region in which the memory cell array is formed.

23 Claims, 10 Drawing Sheets

DATA-ERASABLE NON-VOLATILE SEMICONDUCTOR MEMORY DEVICE

BACKGROUND OF THE INVENTION

The present invention relates to a data-erasable non-volatile semiconductor memory device, and particularly to a non-volatile semiconductor memory device improved in its data-erasing method.

An NOR-type flash memory is one of non-volatile semiconductor memory devices. For example, there is a well-known NOR-type flash memory described in the IEEE-Journal of Solid-State Circuits, vol. 27, No. 11, pp. 1540–1546, November 1992.

FIG. 1 shows a circuit configuration of the memory cell array of a general NOR-type flash memory.

In FIG. 1, a plurality of word lines WL and a plurality of bit lines BL are provided such that each word line and each bit line cross each other (although only two word lines and two bit lines are shown in the figure). Further, a memory cell formed of a non-volatile transistor is provided at each cross point between the word lines WL and bit lines BL. The control gate of each memory cell MC is connected to a corresponding work line WL, and the drain thereof is connected to a corresponding bit line BL. Further, the sources of all the memory cells MC are connected in common to a source line SL.

FIG. 2 is a cross-sectional view showing the element structure of a conventional memory cell MC forming a memory cell forming the memory cell array shown in FIG. 1. In the semiconductor region 101 consisting of a semiconductor substrate or a well region formed on the semiconductor substrate, a source 102 and a drain 103 each made of a diffusion region having a conductive type opposite to the semiconductor region 101 are formed. Further, a floating gate 104 is formed above the channel region between the source 102 and the drain 103. Further, a control gate 105 is formed above the floating gate 104, with a gate insulating film inserted therebetween. In addition, a part of the floating gate 104 overlaps the source 102 with a tunnel oxide film 106 inserted therebetween.

In the memory constructed in the structure described above, data is read in the following manner. That is, a positive voltage of, for example, +5V is applied to a selected word line WL. At this time, a sense amplifier connected to a bit line BL determines "1"/"0" depending on whether or not a current flows through a bit line BL connected to the drain of the memory cell MC. That is, in case of a memory cell of data "1", the threshold voltage is +5V or less. Therefore, when a voltage of +5V is applied to the control gate of the memory cell of the data "1", this memory cell is turned on and a drain current flows. Meanwhile, in case of a memory cell of data "0", the threshold voltage is +5V or more. Therefore, even when a voltage of +5V or more is applied to the control gate of the memory cell of the data "0", no drain current flows. Further, the current difference is detected by the sense amplifier and is outputted as sense data.

Meanwhile, data is written in the following manner. That is, a positive high voltage of, for example, +10V is applied to a selected word line WL, and a voltage of, for example, +5V is applied to the bit line BL selected for writing. In this manner, a current flows through a channel of the memory cell, and hot electrons thereby generated are injected into a floating gate 104. Further, by thus injecting the hot electrons, the threshold voltage of the memory cell into which data has thus been written increases to +5V or more.

On the other hand, during writing, a voltage of 0V is applied to bit lines which are not selected. Therefore, hot electrons are not generated in those non-selected memory cells other than the selected memory cell, so the threshold voltage of each non-selected memory cell does not change but maintains a voltage of +5V or less. Note that erasure is previously executed before writing data to maintain all the memory cells in data-storing states, and data "0" is thereafter selectively written.

Erasure of data is executed at once on a plurality of memory cells, e.g., 512 k memory cells. That is, a positive voltage of, for example, +5V is applied to the source lines SL, and a negative voltage of, for example, –7V is applied to all the word lines WL connected to the memory cells to be subjected to erasure. At this time, through the tunnel oxide film 106 in the overlapping region where the floating gate 104 of the memory cell shown in FIG. 2 overlaps the source 102 thereof, electrons are drained from the floating gate 104 by a tunneling effect, thereby achieving erasure.

Meanwhile, in a conventional memory device, the chip size has come to be reduced by downsizing elements. However, the rate of the overlapping region between the floating gate of the memory cell and the source thereof with respect to the memory size has come to increase. As a result of this, the reduction rate of the memory cell size tends to decrease.

BRIEF SUMMARY OF THE INVENTION

Therefore, the present invention has an object of providing a non-volatile semiconductor memory device capable of improving the reduction rate of the memory cell size.

According to the present invention, there is provided a non-volatile semiconductor memory device comprising: a first semiconductor region having a first conductivity type; a memory cell array including a plurality of memory cells arranged in form of a matrix consisting of rows and columns, each of the plurality of memory cells having second and third semiconductor regions as a source and a drain, which are formed in the first semiconductor region and have a second conductivity type opposite to the first conductivity type, and each of the plurality of memory cells including a control gate and a floating gate; a plurality of word lines respectively connected in common to the rows of the control gates of the plurality of memory cells arranged in the memory cell array; a plurality of bit lines respectively connected in common to the columns of the drains of the plurality of memory cells arranged in the memory cell array; a source line connected in common to the sources of the plurality of memory cells and connected to the first semiconductor region; and a first voltage output circuit for outputting a first voltage to the source line during operation of erasing data from a memory cell in the memory cell array.

Further, according to the present invention, there is provided a non-volatile semiconductor memory device comprising: a semiconductor substrate; a first semiconductor region formed in the substrate and having a first conductivity type; a second semiconductor region formed in the substrate to be separate from the first semiconductor region and having the first conductivity type; a first memory cell array including a plurality of memory cells each having third and fourth semiconductor regions as a source and a drain, which are formed in the first semiconductor region and have a second conductivity type opposite to the first conductivity type, each of the plurality of memory cells including a control gate and a floating gate, and the plurality of memory cells arranged in form of a matrix consisting of rows and columns; a second memory cell array including a plurality of memory cells each having fifth and sixth semiconductor regions as a source and a drain, which are formed in the second semiconductor region and have the second conductivity type opposite to the first conductivity type, each of the plurality of memory cells including a control gate and a floating gate, and the plurality of memory cells arranged in form of a matrix consisting of rows and columns; a plurality of first word lines respectively connected in common to the rows of the control gates of the plurality of memory cells arranged in the first memory cell array; a plurality of second word lines respectively connected in common to the rows of the control gates of the plurality of memory cells arranged in the second memory cell array; a plurality of first bit lines respectively connected in common to the columns of the drains of the plurality of memory cells arranged in the first memory cell array; a plurality of second bit lines respectively connected in common to the columns of the drains of the plurality of memory cells arranged in the second memory cell array; a first source line connected in common to the sources of the plurality of memory cells in the first memory cell array and connected to the first semiconductor region; a second source line connected in common to the sources of the plurality of memory cells in the second memory cell array and connected to the second semiconductor region; a first voltage output circuit for outputting a first voltage to the first source line during operation of erasing data from a memory cell in the first memory cell array; and a second voltage output circuit for outputting a second voltage which is substantially equal to the first voltage to the second source line during operation of erasing data from a memory cell in the second memory cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
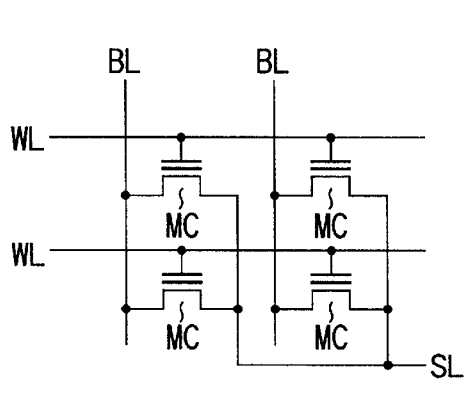
FIG. 1 shows the circuit configuration of a memory cell array of a general NOR type FLASH memory.
Figure 2:
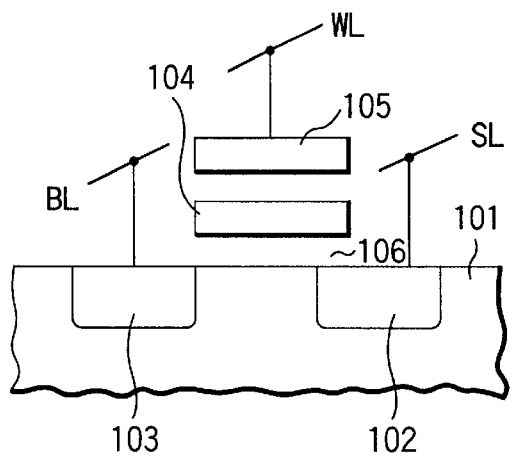
FIG. 2 is a cross-sectional view showing the element structure of a conventional memory cell forming part of the memory cell array shown in FIG. 1.
Figure 3:
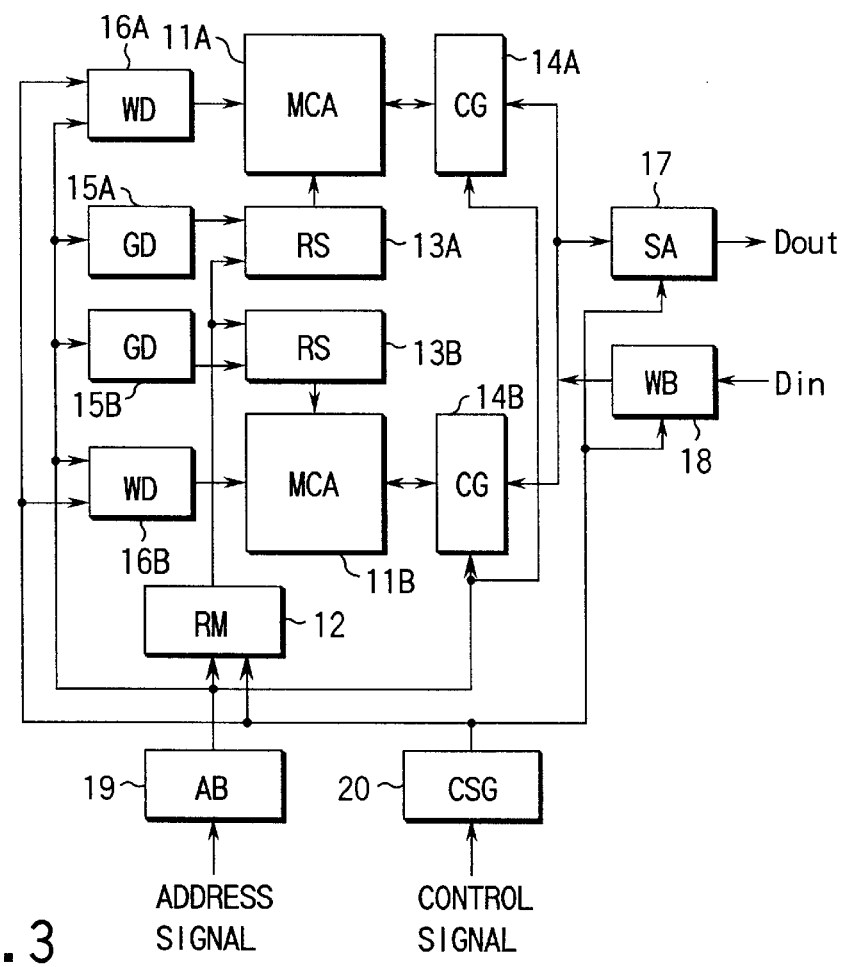
FIG. 3 is a block diagram showing a non-volatile semiconductor memory device according to the first embodiment of the present invention.

In the following, the present invention will be explained with reference to the drawings. FIG. 3 is a block diagram showing a non-volatile semiconductor memory device according a first embodiment of the present invention. The non-volatile semiconductor memory device (which will be hereinafter abbreviated as a memory device) according to the present embodiment comprises: two memory cell arrays (MCA) 11A and 11B each of which is provided with 512 k memory cells; a row decoder which consists of a row main decoder (RM) 12 and two row sub-decoders (RS) 13A and 13B; column gate circuits (CG) 14A and 14B each of which includes a plurality of transistors connected in form of a tree, to select bit lines in the memory cell arrays 11A and 11B; control gate drivers (GD) 15A and 15B for biasing word lines in the memory cell arrays 11A or 11B through the row sub-decoder 13A or 13B selected by the row main decoder 12; well drivers (WD) 16A and 16B for biasing two semiconductor regions (well regions) separated from each other where memory cell arrays 11A and 11B are respectively formed; a sense amplifier (SA) 17 for sensing and amplifying data read from the memory cell arrays 11A and 11B through the column gate circuits 14A and 14B and for outputting the data as read data Dout to the outside of the memory device; a write buffer (WB) 18 for outputting a write signal corresponding to data Din inputted from the outside of the memory device, to corresponding bit lines in the memory cell arrays 11A and 11b through the column gate circuits 14A and 14B; an address buffer (AB) 19 for generating an internal address signal from an address signal inputted from the outside of the memory device; and a control signal output circuit (CSG) 20 for outputting various control signals used in the memory device in accordance with various control signals inputted from the outside of the memory device.

The address buffer (AB) 19 generates a block address signal, a row address signal, and a column address signal, as the internal address signals, from an external address signal.

Various control signals outputted from the control signal output circuit (CSG) 20 are supplied to the well drivers 16A and 16B, the row main decoder (RM) 12, the sense amplifier (SA) 17, and the write buffer (WB) 18. In accordance with these various control signals, operation of respective circuits are controlled.

Figure 4:
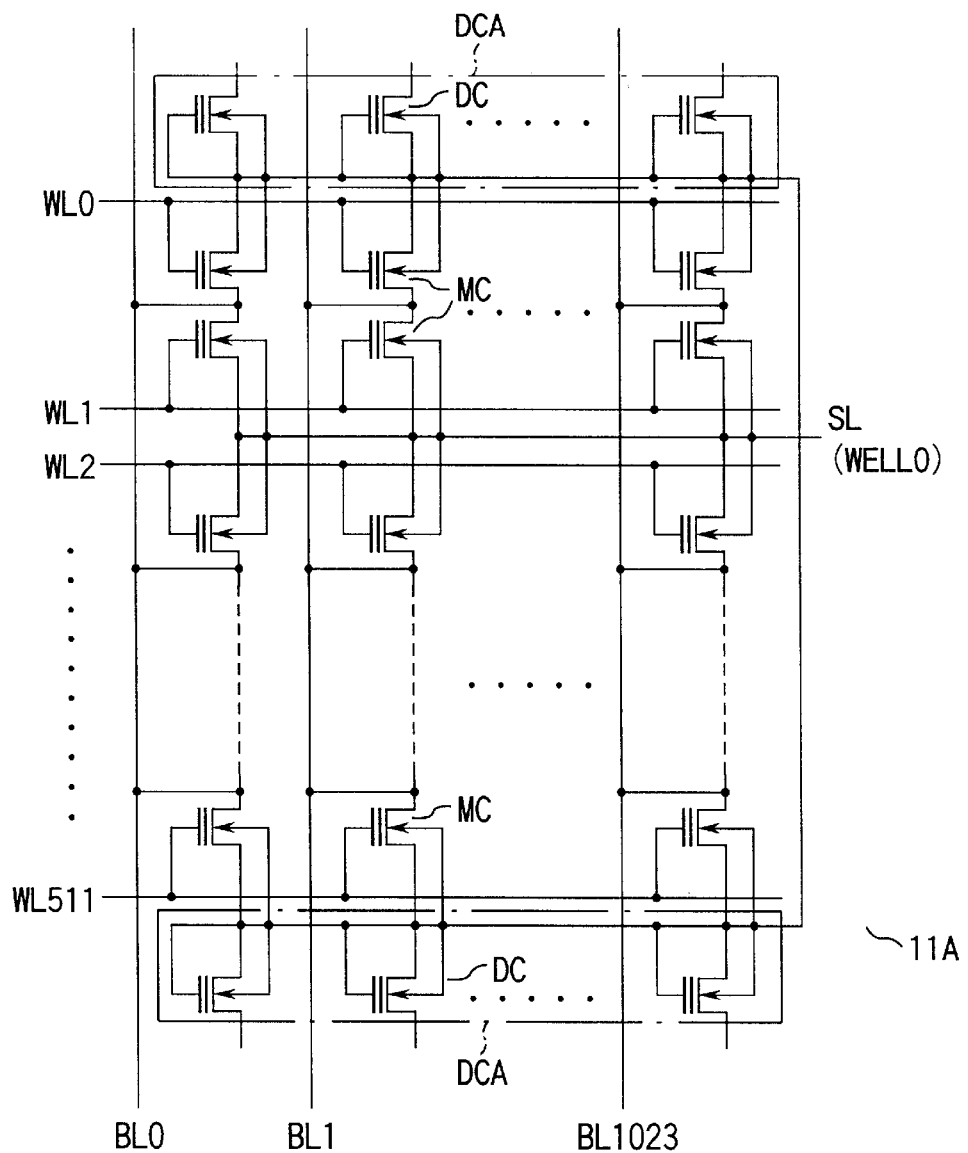
FIG. 4 shows a circuit configuration of a memory cell array shown in FIG. 3.

FIG. 4 shows the detailed circuit configuration of the memory cell array 11A among the two memory cell arrays 11A and 11B shown in FIG. 3. Note that the two memory cell arrays 11A and 11B are constructed in a similar circuit configuration and explanation of the other memory cell array 11B will be omitted herefrom.

On the memory cell array 11A, for example, 512 word lines WL0 to WL511 and 1024 bit lines BL0 to BL1023 are arranged such that each word line and each bit line cross each other. A memory cell MC made of a non-volatile transistor having a floating gate, a control gate, a source, and a drain is provided at each cross point between the word lines and the bit lines. The control gates of the memory cells MC are connected, for every unit of row, to corresponding common word lines. Also, the drains are connected, for every unit of column, to corresponding common bit lines. Among the plurality of memory cells MC, adjacent two memory cells MC in the column direction have a common drain or source and are connected to each other. Further, the sources of all the memory cells MC and the back gates thereof which are the well regions (WELL0) where the memory cells MC are respectively formed are connected in common to a source line SL.

In addition, dummy cell rows CDA each consisting of processing dummy cells DC which correspond in number to (1024) the memory cells connected to each word line are provided respectively at both peripheral portions of the memory cell array 11A in the column direction. The control gates of the dummy cells DC in each dummy cell rows DCA are connected in common, and these common control gates together with the sources and back gates are connected in common to the source lines SL.

In general, memory cells provided at peripheral portions of a memory cell array have characteristics different from those of the memory cells provided at the other portions of the memory cell array than the peripheral portions. Therefore, the characteristics of the memory cells provided at the peripheral portions of the memory cell array are changed in comparison with the characteristics of the memory cells provided at the center portion of the memory cell array. For example, if memory cells provided at peripheral portions has a characteristic that data is erased rapidly when erasing data, there is a case that memory cells in the peripheral portions are erased excessively when data is erased in the memory cells in the center portion. Suppose that the threshold voltage of a memory cell becomes negative due to the excessive erasure. In this case, even when a memory cell arranged on the same bit line as the memory cell having the negative threshold voltage is a memory cell of data "0", a cell current flows through this memory cell thus excessively erased, and therefore, this memory cell is taken as a memory cell of data "1". This means a read error.

The processing dummy cells DC are provided to prevent occurrence of such a read error. That is, by providing at least one row of excessive memory cells (or processing dummy cells DC) at each peripheral portion of the memory cell array, the characteristics of the memory cells in the memory cell array are equalized.

Figure 5:
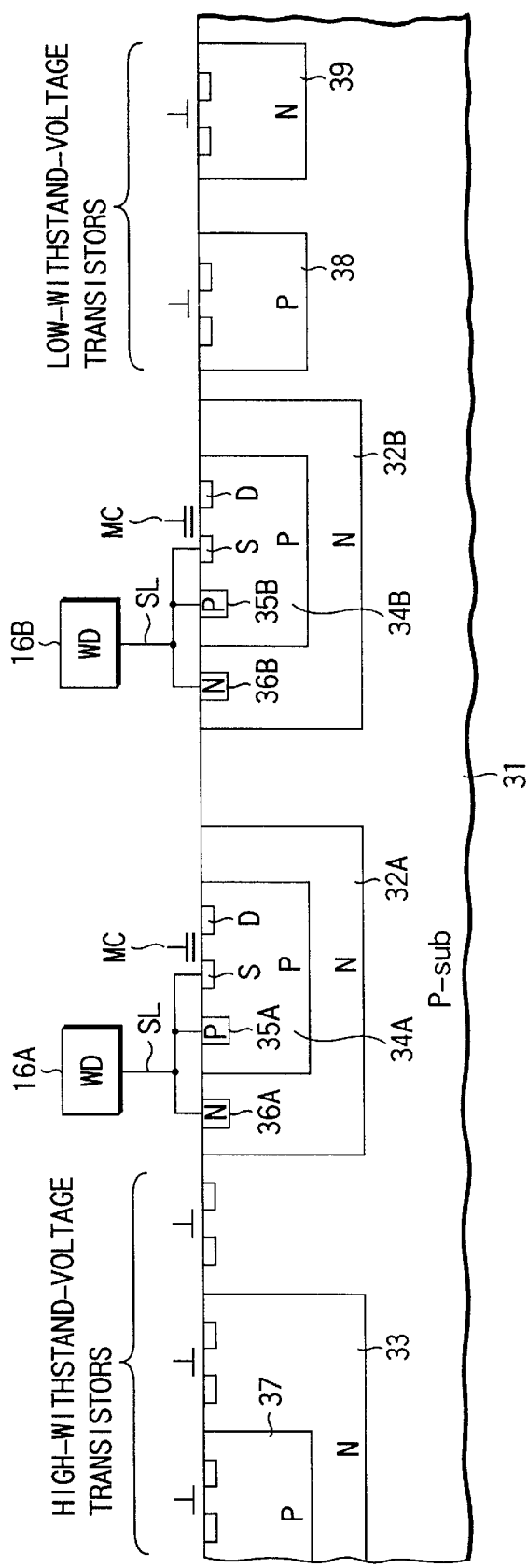
FIG. 5 is a cross-sectional view showing the element structure of a part of the non-volatile semiconductor memory device shown in FIG. 3.

FIG. 5 is a cross-sectional view showing the element structure of a part of the memory device shown in FIG. 3. N-type well regions 32A, 32B, and 33 are formed separately from each other, in the P-type semiconductor substrate 31. P-type well regions 34A and 34B are respectively formed in the N-type well regions 32A and 32B. The memory cells MC in one memory cell array 11A shown in FIG. 3 are formed in one P-type well region 34A, and the memory cells MC in the other memory cell array 11B are formed in the other P-type well region 34B. Note that the figure shows only one memory cell MC for each array.

P-type contact regions 35A and 35B for making contacts with the well regions 34A and 34B are formed respectively in the P-type well regions 34A and 34B. Also, N-type contact regions 36A and 36B for making contacts with the well regions 32A and 32B are respectively formed in the N-type well regions 32A and 32B. The contact regions 35A, 35B, 36A, and 36B together with the sources S of the memory cells MC are connected to the source lines SL. Further, bias voltages outputted from the well drivers (WD) 16A and 16B are applied to corresponding well regions 32A, 32B, 34A, 34B and to the sources S of the memory cells MC through the source lines SL. Note that the drains D of the memory cells MC are connected to corresponding ones of the plurality of bit lines shown in FIG. 4.

Also, as shown in FIG. 5, in each memory cell MC, an overlap region as shown in a conventional device is not formed between the floating gate and the source S. Therefore, the size of each memory cell can be reduced by the area corresponding to the overlap region.

Meanwhile, a P-type well region 37 is formed in the N-type well region 33. Further, N-channel and P-channel MOS transistors used for a peripheral circuit, which are applied with a high voltage and require therefore a high withstand voltage, are formed in each of the semiconductor substrate 31, the P-type well region 37, and the N-type well region 33.

Further, in the P-type semiconductor substrate 31, a P-type well region 38 and an N-type well region 39 are formed separately from each other. N-channel and P-channel MOS transistors used for a peripheral circuit, which does not require a high withstand voltage in the memory device, are formed in each of the P-type and N-type well regions 38 and 39.

Note that only parts of transistors are shown in the figure and a large number of transistors are formed in the semiconductor substrate.

Next, explanation will be made of the operation of the memory device constructed in a structure described above.

Operations for reading and writing data are the same as those in a conventional device. That is, when reading data, one word line WL in the memory cell array 11A or 11B is selected by the row main decoder 12 and the row subdecoder 13A or 13B, and a voltage of +5V outputted from the control gate driver 15A or 15B is applied to the selected word line WL. At this time, voltages of 0v are outputted from the well drivers 16A and 16B and are applied to the well regions WELL (e.g., the P-type well regions 34A and 34B in FIG. 5) where the memory cell arrays 11A and 11B through the source lines SL, respectively. In addition, since the sources of respective memory cells MC are connected to the well regions WELL, a voltage of 0V is applied to the source of each memory cell MC.

Meanwhile, one bit line BL in the memory cell array 11A or 11B is connected to the sense amplifier 17 through the column gate circuit 14A or 14B, and a predetermined read voltage is applied to the bit line connected to the drain of one memory cell thereby selected. At this time, in case where the selected cell is a memory cell storing data "0", the threshold voltage of the selected cell viewed from the word line WL is +5V or less, and therefore, a drain current flows through the selected cell. On the other hand, when a cell storing data "0" is selected, the threshold voltage of the selected cell viewed from the word line WL is +5V or more, no drain current flows through the selected cell. Further, this current difference is detected and amplified by the sense amplifier 17, and is outputted as sense data Dout to the outside.

When writing data, a voltage of +10V outputted from the control gate driver 15A or 15B is applied to a word line selected by the row main decoder 12 and the row sub-decoder 13A or 13B, like in the case of reading. At this time, voltages of 0V are outputted from the well drivers 15A and 15B.

At this time, a signal voltage of 5V outputted from the write buffer 18 in accordance with write data Din is applied to one bit line BL in the memory cell array 11A or 11B through the column gate circuit 14A or 14B. Therefore, a current flows through the drain and source of a selected cell, and hot electrons generated at this time are injected into the floating gate, thereby increasing the threshold voltage of the memory cell to +5V or more. Thus, wiring is achieved.

Note that a voltage of 0V is applied to all non-selected bit lines BL during writing, and hot electrons are not generated in the memory cells connected to these bit lines, so that the threshold voltage of each memory cell is maintained at +5V or less.

Next, erasure operation will be explained with reference to a timing chart shown in FIG. 6. At first, an erasure signal ERASE is set to "H" at a timing T0. Next, at a timing T1 after the timing T0, a voltage of +8V is outputted from the well driver 16A or 16B, so the well regions WELL are started to charge through the source lines SL. At this time, the rising gradient of the voltage of +8V is set to be relatively gentle. This is because, if the voltage of +8V rises sharply, the potential of the word line WL increases due to capacity coupling between the well regions and the word lines WL, so as to be higher than the well potential of P-type MOS transistors forming part of the row sub-decoders 13A and 13B the row sub-decoders 13A and 13B which select the word line WL, and as a result, the P-type MOS transistors cause a forward bias state which must be avoided.

After the well regions WELL are thus charged to +8V, a voltage of −6V is outputted from the gate driver 15A or 15B at a timing T2, and charging of the word line WL is started with use of the voltage of −6V. Here, the timings of the T1 and T2 are separated on the following reasons. That is, the voltage of +8V outputted from the well drivers 16A and 16B and the voltage of −6V outputted from the control gate drivers 15A and 15B are respectively generated by booster circuits not shown. If the booster circuit which generates the voltage of +8V and the booster circuit which generates the voltage of −6V are simultaneously operated, the load capacities of the booster circuits are charged in parallel so that the boost efficiency is lowered. That is, while the booster circuit which generates the voltage of +8V operates and charges the well regions, the booster circuit which generates the voltage of −6V is brought into a non-operating state by setting the word line WL to 0V, so the current consumption can be saved.

Further, erasure is executed when the well regions WELL is at +8V and the word line WL is −6V. That is, when the word line WL is at −6V, the floating gate has a voltage having an absolute value smaller than that of −6V, due to capacity coupling between the control gate and the floating gate. At this time, a tunnel current flows between the floating gate and the entire channel region of the memory cell, and electrons are drained from the floating gate, so the threshold voltage decreases to +5V or less. Thus, erasure is achieved.

After erasure is completed, a voltage of 0V is outputted from the control gate driver 15A or 15B at a timing T3, so the word line WL is reset to 0V. This resetting operation needs to be carried out slowly. This is because, if the word line WL is rapidly reset to 0V, the well voltage increases excessively due to the capacity coupling between the word line and the well region, so a breakdown is caused in the well region or the junction.

Thereafter, the well region is reset to 0V at a timing T4. This reset operation needs to be carried out slowly. This is because, if the reset operation is too rapid, the potential of the word line is rendered negative due to the capacity coupling between the word line and the well region and becomes lower than the well potential (0V) of N-type MOS transistors forming part of the row sub-decoders 13A and 13B, and as a result, the N-type MOS transistors causes a forward bias state which must be avoided.

Thereafter, the erasure signal ERASE is set to "L" at a timing T5, so erasure operation is completed.

Figure 6:
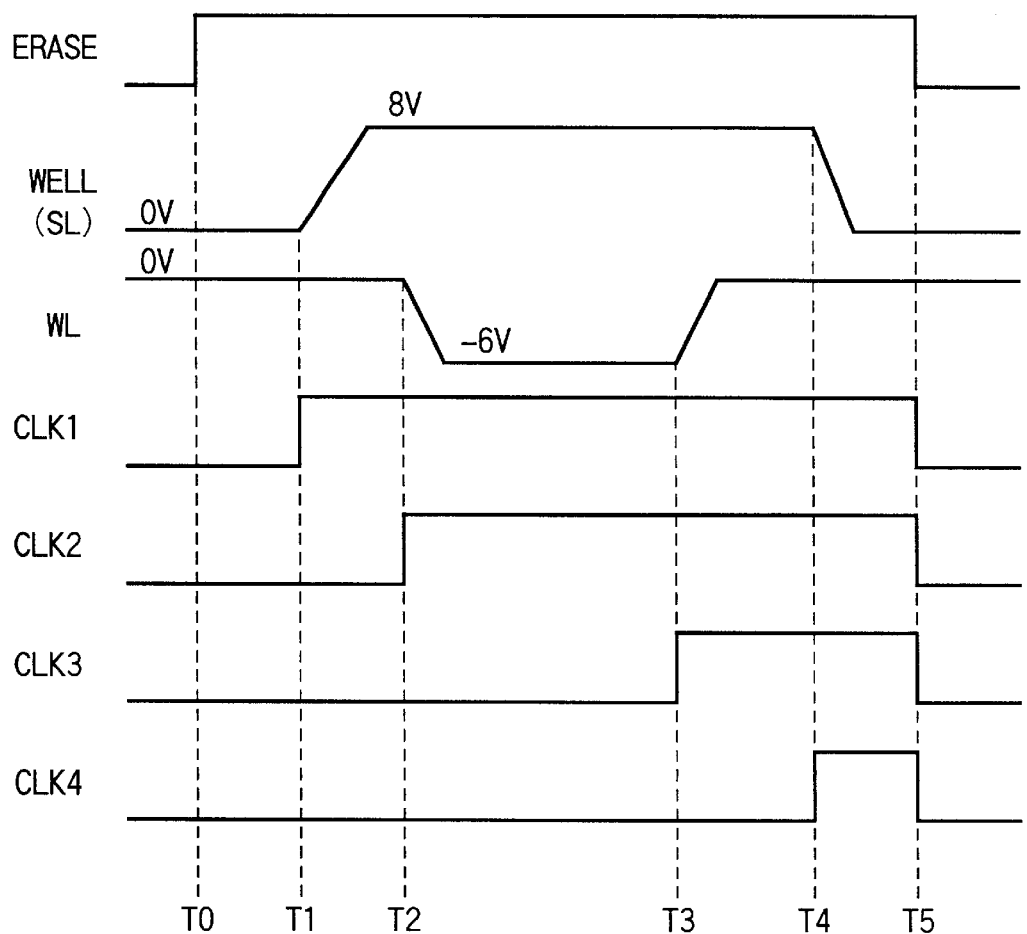
FIG. 6 is a timing chart showing an example of erasure operation of the non-volatile semiconductor memory device shown in FIG. 3.

Note that CLK1 to CLK4 shown in FIG. 6 are clock signals used for controlling the erasure operation described above and these clock signals will be explained later.

Thus, erasure of data is carried out by making a tunnel current flow through the entire channel region. Further, since an overlapping region between the floating gate and the source is not formed in the memory cell, unlike a conventional device, the memory cell size can be improved in comparison with a conventional device.

Also, as shown in FIG. 5, the P-type well region 34A or 34B and the N-type well regions 32A or 32B where the well regions 34A or 34B are formed are connected together to the source lines SL. When writing data and when reading data, the well region 34A or 34B and the source S of the memory cell MC are set together to 0V, and therefore, the well region 34A or 34B and the source S may be short-circuited. In addition, when erasing data, the well region 34A or 34B and the source S may be biased to an equal potential and may be short-circuited to each other. In this manner, wires for the well and the source need not be provided individually, so the wiring area and a drive circuit for driving the wirings can be eliminated.

Further, in the dummy cell rows DCA in FIG. 4 which are provided to prevent erroneous erasure thereby to prevent occurrence of a read error during erasure, the control gate of each dummy cell DC is connected to a source line SL and is applied with 0V when writing or reading data into a memory cell. Therefore, a voltage stress is not applied between the control gate of the dummy cell DC and the well region.

Meanwhile, when erasing data in a memory cell MC, a positive voltage (+8V) is applied to the well region. However, this positive voltage is also applied to the control gate of the dummy cell since the control gate is connected to the well region. In this case, no voltage stress is applied to the dummy cells DC.

Thus, the control gate of the dummy cell DC can be connected to a source line SL in the memory cell array, no wiring from the dummy cell DC to the word line is necessary. As a result, even if dummy cells DC are provided, wiring areas and drive circuits necessary for the dummy cells can be eliminated, so the total area is not much increased.

Figures 7A, 7B:
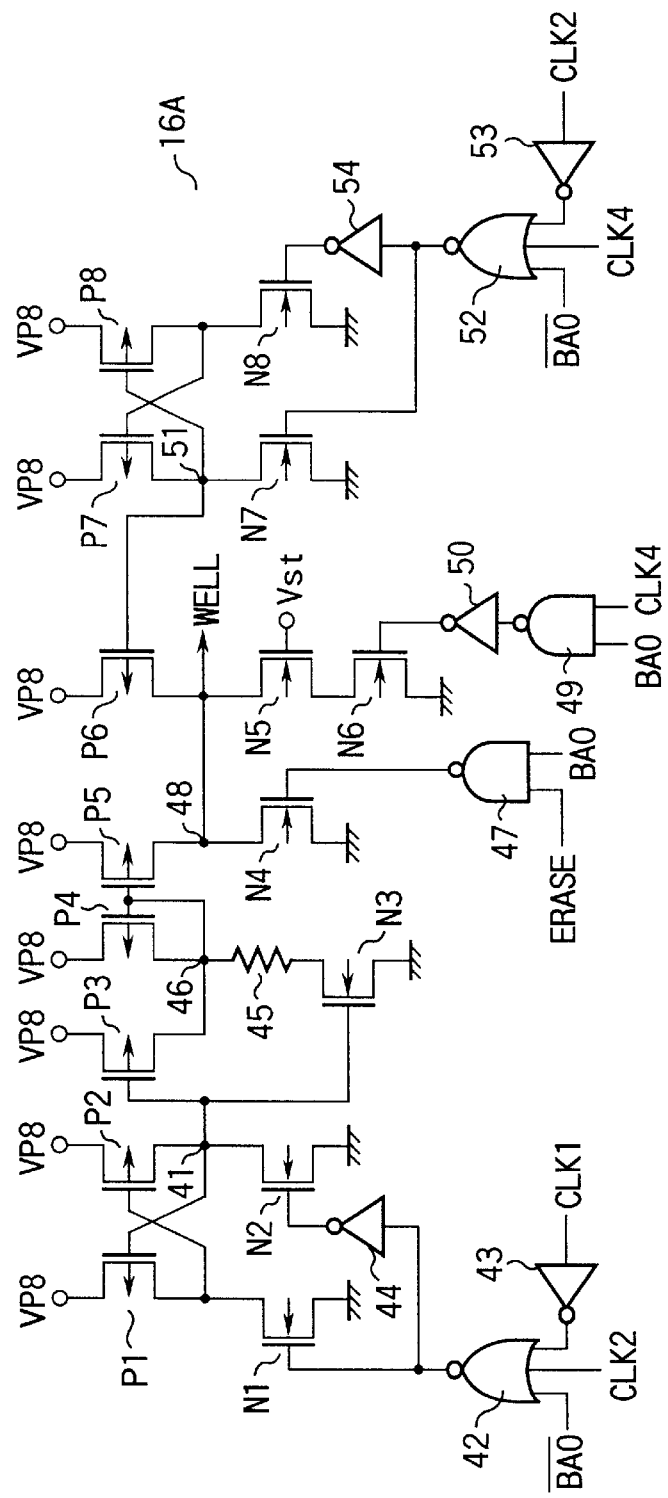
FIG. 7A symbolically shows a well driver shown in FIG. 3.
FIG. 7B shows a detailed circuit configuration of the well driver shown in FIG. 7A.

FIG. 7A is a view symbolically showing one well driver 16A shown in FIG. 3, and FIG. 7B shows a detailed circuit configuration of the well driver. Note that the other well driver 16B shown in FIG. 3 has the same circuit configuration as the well driver 16A except for the internal address signal (block address signals BA and /BA) inputted thereto. Explanation of the well driver 16B will be omitted herefrom.

As shown in FIG. 7A, the well driver 8 (WD) 16A is supplied with clock signals CLK1, CLK2, and CLK4 generated by a control signal generator circuit (CSG) 20 shown in FIG. 3, and block address signals (which will be hereinafter referred to as an address signal) BA0 and /BA0 generated by an address buffer (AB) 19. This well driver 16A outputs a voltage for biasing the well, based on the control signals described above and the power source voltage.

Next, explanation will be made of the circuit configuration shown in FIG. 7B. In FIG. 7B, VP8 denotes a power source voltage of +8V supplied to this circuit.

A current path between a source and a drain of a P-channel MOS transistor (hereinafter abbreviated as a P-transistor) P1 and a current path between a source and a drain of an N-channel MOS transistor (hereinafter abbreviated as an N-transistor) N1 are inserted in series between a supply node of the power source voltage VP8 (which will be hereinafter referred to as a node VP8) and the node for the ground voltage of 0V (which will be hereinafter referred to as a ground node). Further, a current path between a source and a drain of a P-transistor P2 and a current path between a source and a drain of an N-transistor N2 are inserted in series between a node VP8 and a ground node. The gate of the P-transistor P1 is connected to the serial connection node 41 between the P-transistor P2 and the N-transistor N2. The gate of the P-transistor P2 is connected to the serial connection node between the P-transistor P1 and the N-transistor N1.

In addition, a NOR gate 42 having three inputs is directly supplied with an address signal /BA0 and a clock signal CLK2 and is also supplied with a clock signal CLK1 through an inverter 43. Further, an output of the NOR gate 42 is supplied to the gate of the N-transistor N1 and also to the gate of the N-transistor N2 through an inverter 44.

A current path between a source and a drain of a P-transistor P3, a resistor 45, and a current path between a source and a drain of an N-transistor N3 are connected in series between a node VP8 and a ground node. Also, a current path between a source and a drain of a P-transistor P4 is connected between a node VP8 and a serial connection node 46 between the P-transistor P3 and the resistor 45. The gate of this P-transistor P4 is connected to a node 46.

A current path between a source and a drains of a P-transistor P5 and a current path between a source and a drains of an N-transistor N4 are connected in series between a node VP8 and a ground node. The gate of the P-transistor P5 is connected to the node 46. Also the gate of the N-transistor N4 is supplied with an output of a NAND gate 47 having two inputs. This NAND gate 47 is supplied with an erasure signal ERASE and an address signal BA0. In addition, a bias voltage to be supplied to the well region WELL is outputted from a serial connection node 48 between the P-transistor P5 and the N-transistor N4.

A current path between a source and a drain of a P-transistor P6 is connected between a node VP8 and the node 48. Also, current paths between sources and drains of two N-transistors N5 and N6 are connected in series between a node 48 and a ground node. The gate of the N-transistor N5 is supplied with a bias voltage Vst of a constant value. A NAND gate 49 having two inputs is supplied with a clock signal CLK4 and an address signal BA0, and an output of the NAND gate 49 is supplied to the N-transistor N6 through an inverter 50.

A current path between a source and a drain of a P-transistor P7 and a current path between a source and a drain of an N-transistor N7 are inserted in series between a node VP8 and a ground node. Further, a current path between a source and a drain of a P-transistor PB and a current path between a source and a drain of an N-transistor N8 are inserted in series between a node VP8 and a ground node. The gate of the P-transistor P7 is connected to a serial connection node between the P-transistor P8 and the N-transistor N8. The gate of the P-transistor P8 is connected to a serial connection node 51 between the P-transistor P7 and the N-transistor N7. The gate of the P-transistor P6 is connected to the node 51.

In addition, an NOR gate 52 having three inputs is directly supplied with an address signal /BA0 and a clock signal CLK4 and is further supplied with a clock signal CLK2 through an inverter 53. Further, an output of the NOR gate 52 is supplied to the gate of the n-transistor N7 and also to the gate of the N-transistor N8 through an inverter 54.

The element size of the P-transistor P6 is set to be larger in comparison with the P-transistor P5, and the element size of the N-transistor N4 is set to be larger in comparison with the N-transistor N5.

Next, operation of a well driver constructed as described above will be explained with reference to the timing chart shown in FIG. 6. Note that when the well driver operates, the address signal BA0 is at "H" and the address signal /BA0 is at "L".

When the erasure signal ERASE is at "L", the output of the NAND gate 47 is at "H", and the N-transistor N4 is turned on so that the well bias voltage is 0V.

Next, when the erasure signal ERASE goes to "H" at the timing T0, the output of the NAND gate 47 goes to "L" and the N-transistor N4 which has been turned on is turned off.

During the period from the timing T0 to the timing T1, all the clock signals CLK1 to CLK4 are at "L". Therefore, the output of the NOR gate 42 is at "L", and the output of the inverter 44 subsequent thereto is at "H". The N-transistor N2 is turned on to make the node 41 go to "L". Further, the P-transistor P3 having a gate to which the signal of the node 41 is inputted is turned on, the node 46 goes to VP8 (+8V), and the P-transistors P4 and P5 are turned off. In addition, the output of the NAND gate 49 is at "H", and the output of the inverter 50 subsequent thereto is at "L". The N-transistor N8 is turned on to make the node 51 go to "H" (VP8). Therefore, the P-transistor P6 having a gate to which the signal of the node 51 is inputted is turned off.

Next, when the clock signal CLK1 rises to "H" at the timing T1, the output of the NOR gate 42 goes to "H" and the output of the inverter 44 subsequent thereto goes to "L". The N-transistor N1 is turned on to make the connection node with the P-transistor P1 go to "L". As a result of this, the P-transistor P2 is turned on, so the node 41 goes to "H" (VP8). Further, the N-transistor N3 having a gate to which the signal of the node 41 is inputted is turned on, so a constant current flows through the P-transistor P4 through the resistor 45. At this time, since the P-transistors P4 and P5 construct a current mirror circuit, the constant current which flows through the resistor 45 also flows through the P-transistor P5, and charging of the node 48 is started. At this time, since the current which flows through the resistor 45 is set to be relatively small, the rising gradient of the voltage 8V becomes relatively gentle as described previously, when charging of the well region WELL is started by a source line SL.

Next, when the clock signal CLK2 rises to "H" at the timing T2, the output of the NOR gate 52 goes to "H" and the output the inverter 54 subsequent thereto goes to "L". The N-transistor N7 is turned on, so the connection node with the P-transistor P7 goes to "L". As a result of this, the P-transistor P6 having a large element size is turned on, so charging of the node 48 is started with a sufficiently large current.

Next, when the clock signal CLK4 rises to "H" at the timing T4, the output of the NOR gate 52 drops to "L" again, and the output of the inverter 54 subsequent thereto rises to "H". The N-transistor N8 is turned on thereby making the node 51 go to "H" again. The P-transistor P6 is turned off, so charging to the node 48 is finished. In addition, since the clock signal CLK4 thus rises to "H", the output of the NAND gate 49 drops from "H" to "L", and the output of the inverter 50 subsequent thereto rises from "L" to "H", so the N-transistor N6 is turned on. Here, since the gate of the N-transistor N5 connected in series with the N-transistor N6 is supplied with a constant bias voltage Vst, discharging of the node 48 is started after the N-transistor N6 is turned on. In this case, since the element size of the N-transistor N5 is set to be small, discharging of the node 48 is carried out slowly, i.e., reset operation is carried out slowly, as described previously.

Next, the erasure signal ERASE drops to "L" after the timing T5, and all the clock signals CLK1 to CLK4 drop to "L", so an initial state is recovered.

Figure 8A:
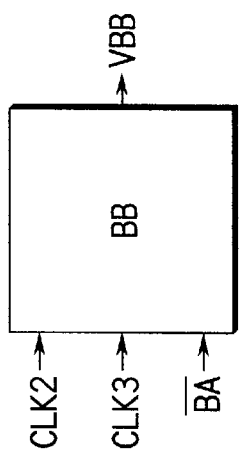
FIG. 8A symbolically shows a voltage output circuit for outputting a negative voltage outputted to a word line when erasing data.
Figure 8B:
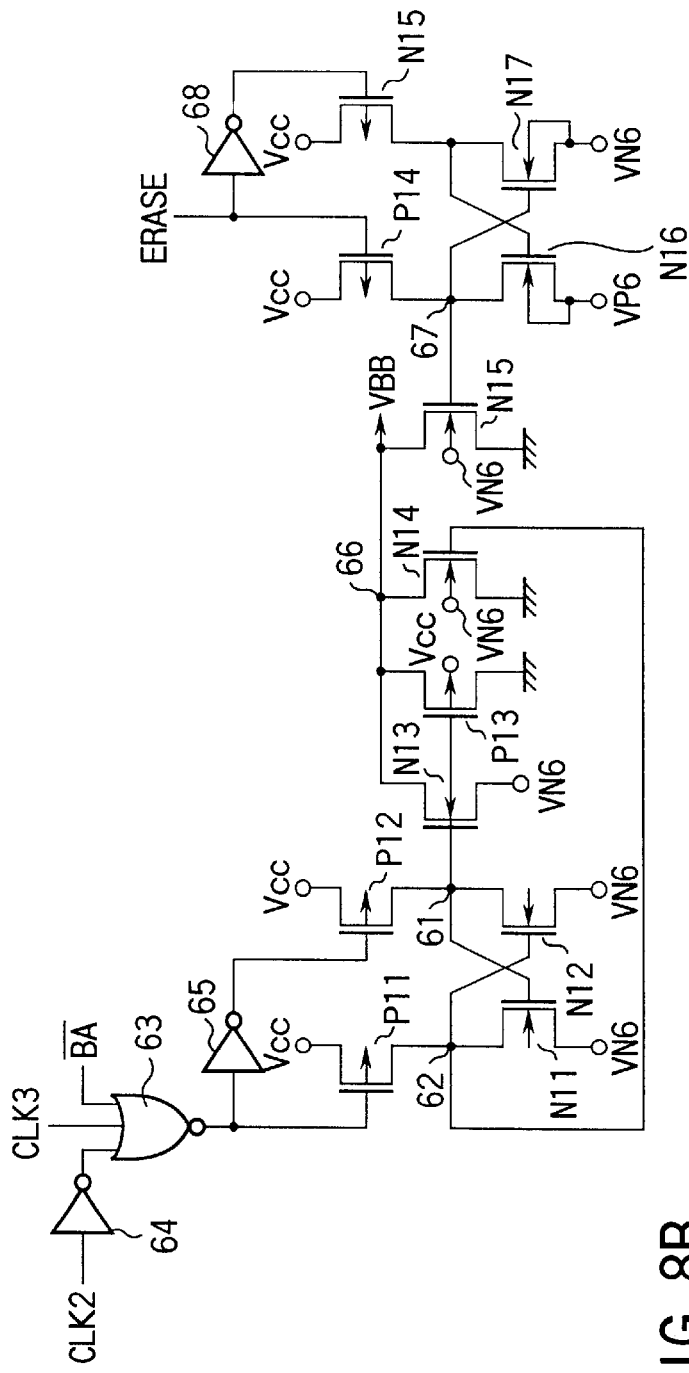
FIG. 8B shows a detailed circuit configuration of the voltage output circuit shown in FIG. 8A.

FIG. 8A symbolically shows a control circuit (BB) which controls the voltage of −6V outputted to the word line when erasing data. FIG. 8B shows a detailed circuit configuration thereof. Note that this control circuit (BB) may be provided in the row main decoder (RM) 13 described previously or may be provided outside the row main decoder (RM) 13.

As shown in FIG. 8A, this control circuit (BB) is supplied with the clock signals CLK2 and CLK3 generated by the control signal generator circuit (CSG) 20 described above, the address signal /BA generated by the address buffer (AB) 19, and the power source voltages of +5V and −6V. Further, this control circuit (BB) outputs a voltage VBB to be supplied to the word line.

Next, the circuit configuration shown in FIG. BB will be explained. In FIG. 8B, Vcc and VN6 respectively denote power source voltages of +5V and −6V supplied to this circuit.

A current path between a source and a drain of a P-transistor P11 and a current path between a source and a drain of an N-transistor N11 are inserted in series between a supply node of the power source voltage Vcc (which will be hereinafter referred to as a node Vcc) and a supply node of the power source voltage VN6 (which will be hereinafter referred to as a node VN6). Further, a current path between a source and a drain of a P-transistor P12 and a current path between a source and a drain of an N-transistor N12 are inserted in series between a node Vcc and a node VN6. The gate of the N-transistor N11 is connected to a serial connection node 61 between the P-transistor P12 and the N-transistor N12. The gate of the N-transistor N12 is connected to a serial connection node 62 between the P-transistor P11 and the N-transistor N11. An NOR gate 63 having three inputs is directly supplied with an address signal /BA and a clock signal CLK3 and is also supplied with a clock signal CLK2 through an inverter 64. Further, an output of the NOR gate 63 is supplied to the gate of the P-transistor P11 and to the gate of the P-transistor P12 through an inverter 65.

A current path between a source and a drain of a N-transistor N13 is connected between a node 66 to which a voltage VBB is outputted and a node VN6. Further, a current path between a source and a drain of a P-transistor P13 and current paths between sources and drains of two N-transistors N14 and N15 are connected in parallel between the node 66 and ground nodes. The back gate of the P-transistor P13, i.e., the well region where this transistor is formed is supplied with a power source voltage Vcc of 5V, and the back gates of the two N-transistors N14 and N15 are supplied with a power source voltage VN6 of −6V.

Each gate of the N-transistor N13 and the P-transistor P13 is connected to the node 61, and the gate of the N-transistor n14 is connected to a serial connection node 62 between the P-transistor P11 and the N-transistor N11.

A current path between a source and a drain of a P-transistor P14 and a current path between a source and a drain of an N-transistor N16 are connected in series between a node Vcc and a node VN6. Further, a current path between a source and a drain of a P-transistor P15 and a current path between a source and a drain of an N-transistor N17 are inserted in series between a node Vcc and a node VN6. The gate of the N-transistor P16 is connected to a serial connection node between the P-transistor P15 and the N-transistor N17. The gate of the P-transistor P17 is connected to a serial connection node 67 between the P-transistor P14 and the N-transistor N16. Further, the gate of the N-transistor N15 is connected to the node 67. The gate of the P-transistor P13 is supplied with an erasure signal ERASE, and further, the gate of the P-transistor P14 is supplied with the erasure signal ERASE through an inverter 68.

Note that the element size of the N-transistor N15 is set to be larger in comparison with the N-transistor N14 so that the value of the current which is allowed to flow by the N-transistor N15 is set to be larger than the N-transistor N14.

Next, operation of the control circuit constructed in the structure as shown in FIG. 8B will be explained. Note that the address signal /BA is at "L" when this control circuit operates.

At first, in the period which is not an erasure period, i.e., in the period in which the erasure signal ERASE is at "L" (both in writing and reading), the output of the inverter 68 to which the erasure signal ERASE is inputted is at "H" and the P-transistor P14 is therefore turned on and the P-transistor P15 is turned off, so the node 67 is at "H" (Vcc). The N-transistor N15 having a gate supplied with the signal of the node 67 is turned on, and the node 66 is discharged, so the VBB is set to 0V as a ground voltage.

Meanwhile, in the erasure period, the erasure signal is at "H" and the output of the inverter 68 is at "L". Therefore, the node 67 is at "L" (VN6), so the N-transistor N15 is turned off.

Before the timing T2 in the timing chart shown in FIG. 6, i.e., when the clock signals CLK2 and CLK3 are both at "L", the output of the inverter 64 is at "H", the output of the NOR gate 63 is at "L", and the output of the inverter 65 subsequent thereto is at "H". The P-transistor P11 and the N-transistor n12 are therefore turned on, and the P-transistor P12 and the N-transistor N11 are turned off, so the node 61 is at "L" (VN6) and the node 62 is at "H" (Vcc). At this time, the N-transistor N13 having a gate inputted with the signal of the node 61 is turned off, and the P-transistor P13 is turned on. Further, the N-transistor N14 having a gate inputted with the signal of the node 62 is turned on. Therefore, when the clock signals CLK2 and CLK3 are both at "L", the node 66 is discharged through the P-transistor P13 and the N-transistor N14 which are each turned on, so the VBB is set to 0V as a ground voltage.

Next, when one clock CLK2 rises to "H" at the timing T2 in the timing chart shown in FIG. 6, the output of the inverter 64 is inverted from "H" to "L", and the output of the NOR gate 63 is inverted from "L" to "H". Further, the output of the inverter 66 is inverted from "H" to "L". As a result of this, the P-transistor P12 and the N-transistor N11 are turned on, and the P-transistor P11 and the N-transistor N12 are turned off, so that the node 61 changes from "L" (VN6) to "H" (Vcc) and the node 62 changes from "H" (Vcc) to "L" (VN6). At this time, the N-transistor N13 is turned on, and the P-transistor P13 and the N-transistor N13 which have been turned on are turned off. Therefore, after the clock signal CLK2 rises to "H", the node 66 is charged with the power source voltage VN6, and the VBB changes toward −6V.

Thereafter, the other clock signal CLK3 rises to "H" at the timing T3 in the timing chart shown in FIG. 6. Then, the output of the NOR gate 63 goes to "L" again, so the P-transistor P13 and the N-transistor N14 are turned on like in the case before the timing T2. The node 66 is discharged, and the VBB is set to 0V as a ground voltage.

That is, from the control circuit shown in FIG. 8B, a voltage of −6V is outputted during the period from the timing T2 to the timing T3 shown in FIG. 6, and a voltage of 0V is outputted during the other periods.

Figure 9A:
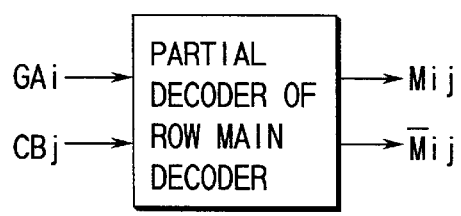
FIG. 9A symbolically shows a partial decoder in a row main decoder shown in FIG. 3.
Figure 9B:
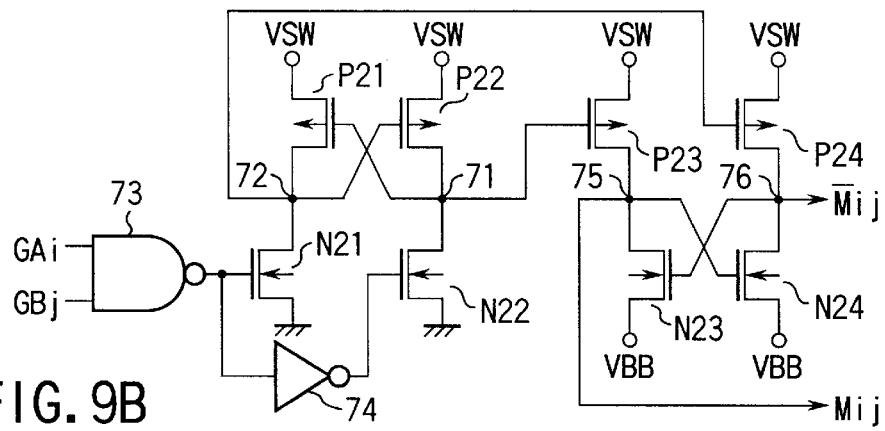
FIG. 9B shows a detailed circuit configuration of the partial decoder shown in FIG. 9A.

The row main decoder (RM) 12 in FIG. 3 has a plurality of partial decoders. FIG. 9A symbolically shows one of the partial decoders in the row main decoder (RM) 12, and FIG. 9B shows a detailed circuit configuration thereof.

As shown in FIG. 9A, the partial decoder of the row main decoder (RM) 12 is supplied with pre-decoded signals GAi and GBj (where each of i and j is a number of 0 to 7) outputted from the pre-decoder described later, and this partial decoder outputs main-decoded signals Mij and /Mij. Since each of i and j takes eight numbers, 8×8=64 partial decoders each shown in FIG. 9A are provided in the row main decoder 13.

Next, explanation will be made of the circuit configuration shown in FIG. 9B. In FIG. 9B, VSW denotes a power source voltage supplied to the partial decoder. The value of this power source voltage is +5V when reading data and is +10V when writing data. Also, VBB is a voltage outputted from the circuit shown in FIG. 8A.

A current path between a source and a drain of a P-transistor P21 and a current path between a source and a drain of an N-transistor N21 are inserted in series between a supply node of the power source voltage VSW (which will be hereinafter referred to as a node VSW) and a ground voltage node. Further, a current path between a source and a drain of a P-transistor P22 and a current path between a source and a drain of an N-transistor N22 are inserted in series between a node VSW and a ground voltage node. The gate of the P-transistor P21 is connected to a serial connection node 71 between the P-transistor P22 and the N-transistor N22. The gate of the P-transistor P22 is connected to a serial connection node 72 between the P-transistor P21 and the N-transistor N21. In addition, a NAND gate 73 having two inputs is supplied with either one of a pre-decoded signal GAi and a complementation signal thereof and with either one of a pre-decoded signal GBj and a complementation signal thereof. In the case of the figure, pre-decoded signals GAi and GBj are supplied. The output of the NAND gate 73 is supplied to the gate of the N-transistor N21 and also to the gate of the N-transistor N22 through an inverter 74.

A current path between a source and a drain of a P-transistor P23 and a current path between a source and a drain of an N-transistor N23 are inserted in series between a node VSW and a ground voltage node. Further, a current path between a source and a drain of a P-transistor P24 and a current path between a source and a drain of an N-transistor N24 are inserted between a node VSW and a ground voltage node. The gate of the P-transistor P23 is connected to the node 71 described previously, and the gate of the P-transistor P24 is connected to the node 72 described previously. Further, a main decoded signal Mij is outputted from a serial connection node 75 between the P-transistor P23 and the N-transistor N23, and a main decoded signal /Mij is outputted from a serial connection node 76 between the P-transistor P24 and the N-transistor N24.

In the partial decoder shown in FIG. 9B, when the pre-decoded signals GAi and GBj are both at "H", i.e., under condition that the partial decoder shown in the figure is selected, the output of the NAND gate 73 is at "L", and the output of the inverter 74 subsequent thereto is at "H", so the N-transistor N21 is turned off and the N-transistor N22 is turned on. In this manner, the node 71 goes to "L", and the P-transistor P21 is further turned on, so the node 72 goes to "H" (VSW) and the P-transistor P22 is turned off.

Accordingly, the P-transistor P23 is turned on and the P-transistor P24 is turned off. In addition, when the P-transistor P23 is turned, the node 75 goes to "H" (VSW) and the N-transistor N24 is turned on. As a result, the node 76 goes to "L" and the N-transistor N23 is turned off.

That is, when the pre-decoded signals GAi and GBj are both at "H", the main decoded signals Mij and /Mij are respectively at "H" and "L", so a selected state is formed.

In addition, the other partial decoders, at least one of two pre-decoded signals inputted to the NAND gate 73 goes to "L". The output of the NAND gate 73 goes to "H" and the output of the inverter 74 goes to "L", so the main decoded signals Mij and /Mij go to "L" and "H", respectively. A non-selected state is thus formed.

Figure 10A:
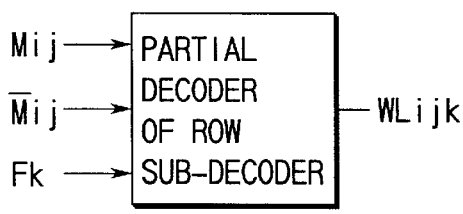
FIG. 10A symbolically shows a partial decoder in a row main decoder shown in FIG. 3.
Figure 10B:
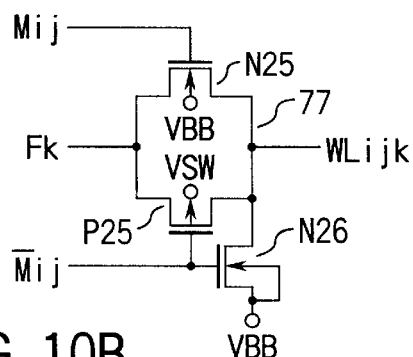
FIG. 10B shows a detailed circuit configuration of the partial decoder shown in FIG. 10A.

Each of the row sub-decoders (RS) 13A and 13B shown in FIG. 3 includes a plurality of partial decoders. FIG. 10A symbolically shows one partial decoder in a row sub-decoder (RS) 13A or 13B shown in FIG. 3, which is supplied with main decoded signals Mij and /Mij outputted from the row main decoder 12 and with an output Fk of the control gate driver (GD) 15A or 15B shown in FIG. 3. FIG. 10B shows a detailed circuit configuration thereof.

As has been described previously, each of i and j takes eight numbers, and k also takes eight numbers. Therefore, 64×8=512 partial decoders each shown in FIG. 10A are provided in each row sub-decoder. The output of each partial decoder is outputted to a corresponding one of 512 word lines WLijk (WL0 to WL511 in FIG. 4).

Next, explanation will be made of the circuit configuration shown in FIG. 10B. The partial decoder shown in FIG.

10B consists of an N-transistor N25 and a P-transistor P25 and comprises a node of the output Fk of the control gate driver 15A or 15B, a transfer gate 77 of CMOS type which is inserted between the decoder itself and a corresponding word line WLijk, and an N-transistor N26 connected between the word line WLijk and a node of the voltage VBB outputted from the circuit shown in FIG. 8A. Further, each of the gates of the N-transistor N25 and the P-transistor P25 is supplied with main decoded signals Mij and /Mij generated by the partial decoder of the row main decoder shown in FIG. 9A, and the gate of the N-transistor N26 is supplied with a main decoded signal /Mij.

In the partial decoder of the row sub-decoder thus constructed, when the main decoded signals Mij and /Mij are respectively at "H" and "L", the transfer gate 77 is turned on and the output Fk of the control gate driver 18 or 19 is outputted to the word line WLijk.

On the other hand, when the main decoded signals Mij and /Mij are respectively at "L" and "H", the transfer gate 77 is turned off and the N-transistor N26 is turned on, so the voltage VBB is outputted to the word line WLijk.

Figure 11A:
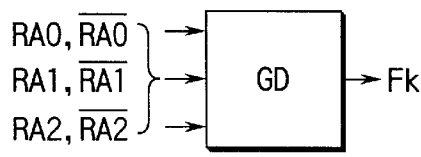
FIG. 11A symbolically shows a driver circuit in the control gate driver shown in FIG. 3.

Each of the control gate driver (GD) 15A and 15B in FIG. 3 has a plurality of driver circuits. FIG. 11A symbolically shows one driver circuit in the control gate driver (GD) 15A or 15B in FIG. 3, and FIG. 11B shows a detailed circuit configuration thereof.

Here, the control gate driver 15A or 15B is inputted with internal row addresses RA0 and /RA0 to RA2 and /RA2 of 3-bit, which are generated by the address buffer (AB) 19 in FIG. 3. Therefore, eight driver circuits as shown in FIGS. 11A and 11B are included in each control gate driver. FIG. 11B shows such one of the eight driver circuits that is inputted with address signals /RA0, /RA1, and /RA2 of, for example, three bits and outputs F0 (k=0), for example. The other driver circuits are constructed in the same structure as that shown in FIG. 11B, except that different input signals are inputted to the other driver circuits. Therefore, explanation of the other driver circuits will be omitted herefrom.

Figure 11B:
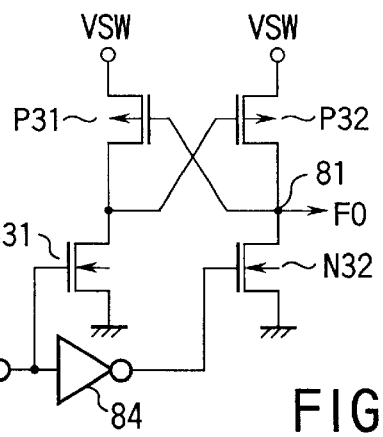
FIG. 11B shows a detailed circuit configuration of the driver circuit shown in FIG. 11A.

In FIG. 11B, a current path between a source and a drain of a P-transistor P31 and a current path between a source and a drain of an N-transistor N31 are inserted in series between a node VSW and a ground voltage node. Further, a current path between a source and a drain of a P-transistor P32 and a current path between a source and a drain of an N-transistor N32 are inserted in series between a node VSW and a ground voltage node. The gate of the P-transistor P31 is connected to a serial connection node 81 between the P-transistor P32 and an N-transistor N32. The gate of the P-transistor P34 is connected to a serial connection node between the P-transistor P31 and the N-transistor N31.

In addition, the NAND gate 82 having three inputs is inputted with 3-bit addresses /RA0, /RA1, and /RA2. The output of this NAND gate 82 is supplied to the gate of the N-transistor N31 through an inverter 83. The output of the inverter 83 is further supplied to the gate of the N-transistor N32 through an inverter 84. Further, F0 is outputted from the node 81.

In the circuit constructed in the structure as described above, when all the 3-bit address signals /RA0, /RA1, and /RA2 are at "H", i.e., under the condition that this drive circuit is selected, the output of the NAND gate 82 is at "L", the output of the inverter 83 is at "H", and the output of the inverter 84 is at "L", so the N-transistor N31 is turned on and the N-transistor N32 is turned off. The output F0 is therefore "H" (VSW).

At this time, in each of the other seven diver circuits, at least one of 3-bit address signals is at "L". Therefore, the output of the NAND gate 82 is at "H", the output of the inverter 83 is at "L", and the output of the inverter 84 is at "H". Accordingly, the N-transistor N31 is turned off and the N-transistor N32 is turned on, so the output Fk is at "L" (the ground voltage).

Figure 12A:
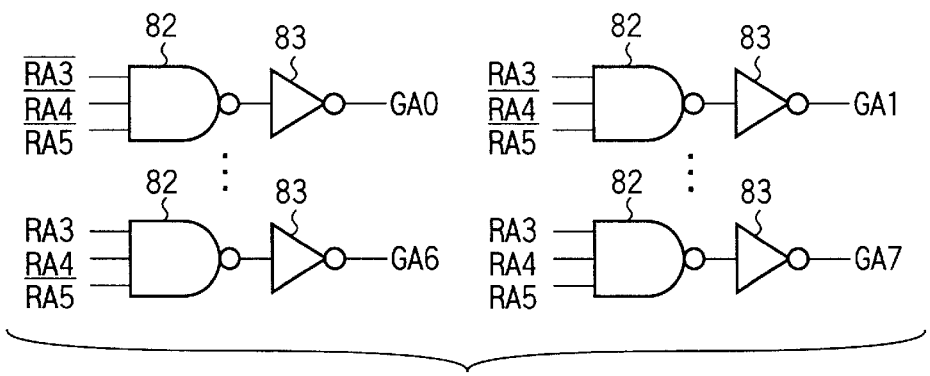
FIG. 12A shows a detailed circuit diagram showing pre-decoders for generating pre-decoded signals GAi.
Figure 12B:
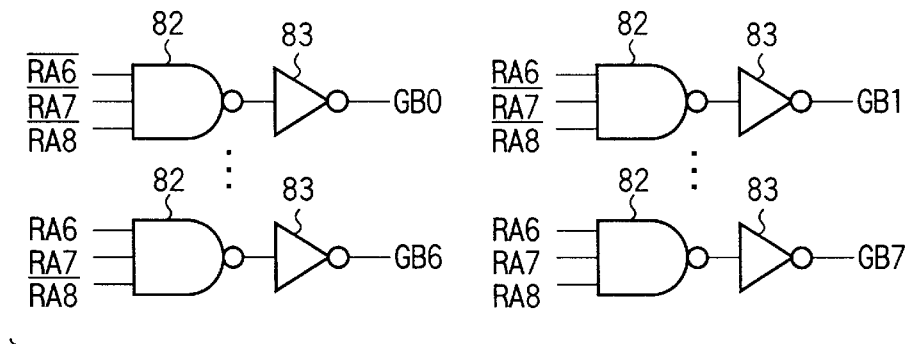
FIG. 12B shows a detailed circuit diagram showing pre-decoders for generating pre-decoded signals GBj.

FIGS. 12A and 12B show detailed circuit configurations of pre-decoders which generate pre-decoded signals GAi and GBj (where i and j are each number of 0 to 7) inputted to the partial decoders in the row main decoder (RM) 12 shown in FIGS. 9A and 9B.

Each of eight pre-decoders which generate pre-decoded signals GAi (GA0 to GA7) comprises a NAND gate 82 having three inputs and an inverter 83, as shown in FIG. 12A. The NAND gate 82 is supplied with a combination among 3-bit internal row address signals RA3, RA4, and RA5 and their complementary signals /RA3, /RA4, and /RA5. The output of this NAND gate 82 is inverted by the inverter 83 thereby to output pre-decoded signals GAi (GA0 to GA7).

Each of eight pre-decoders shown in FIG. 12B, which generate pre-decoded signals GBi (GB0 to GB7), comprises a NAND gate 82 and an inverter 83, like the pre-decoders shown in FIG. 12A. In this case, the NAND gate 82 is supplied with a combination among 3-bit internal row address signals RA6, RA7, and RA8 and their complementary signals /RA6, /RA7, and /RA8, in place of a combination among 3-bit internal row address signals RA3, RA4, and RA5 and their complementary signals /RA3, /RA4, and /RA5. Each inverter 83 outputs a pre-decoded signal GBi (GB0 to GB7).

Figure 13:
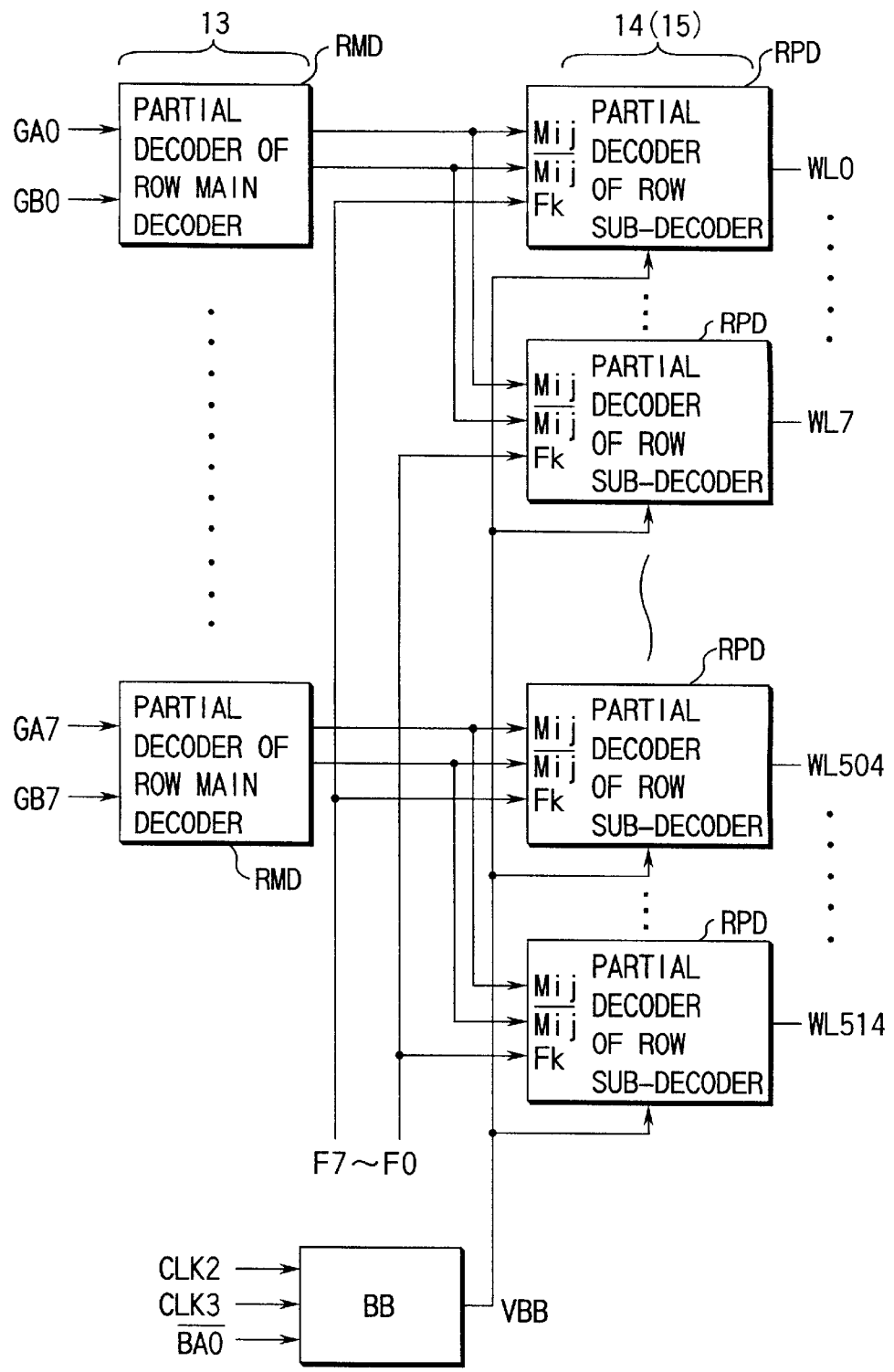
FIG. 13 is a block diagram showing the entire row decoder consisting of the voltage output circuit shown in FIG. 8A, the row main decoder shown in FIG. 9A, and the row sub-decoders shown in FIG. 10A.

FIG. 13 is a block diagram showing the entire row decoder consisting of the control circuit (BB) shown in FIGS. 8A and 8B, row main decoder (RM) 12 shown in FIGS. 9A and 9B, and the row sub-decoders (RS) 13A and 13B shown in FIGS. 10A and 10B. Each word line WL is connected to one partial decoder RPD in the row sub-decoders. Further, eight partial decoders RPD are controlled by the outputs Mij and /Mij from one partial decoder RMD in the row main decoder 12. In addition, the outputs F0 to F7 of the control gate driver 15A (15B) are inputted sequentially to every eight the partial decoders RPD in the row sub-decoder.

As described above, 64 partial decoders RMD are provided in the row main decoder 12, and the output of each respective partial decoder RMD is supplied to eight partial decoders RPD.

Here, when reading and writing data, the voltage VSW is outputted to one word line selected by row addresses RA0 to RA8, and the voltage VBB is outputted to the other word lines. The voltage VSW is set to +10V when writing data and is set to +5V when reading data. The voltage VBB is set to OV both when writing data and when reading data.

Figure 14:
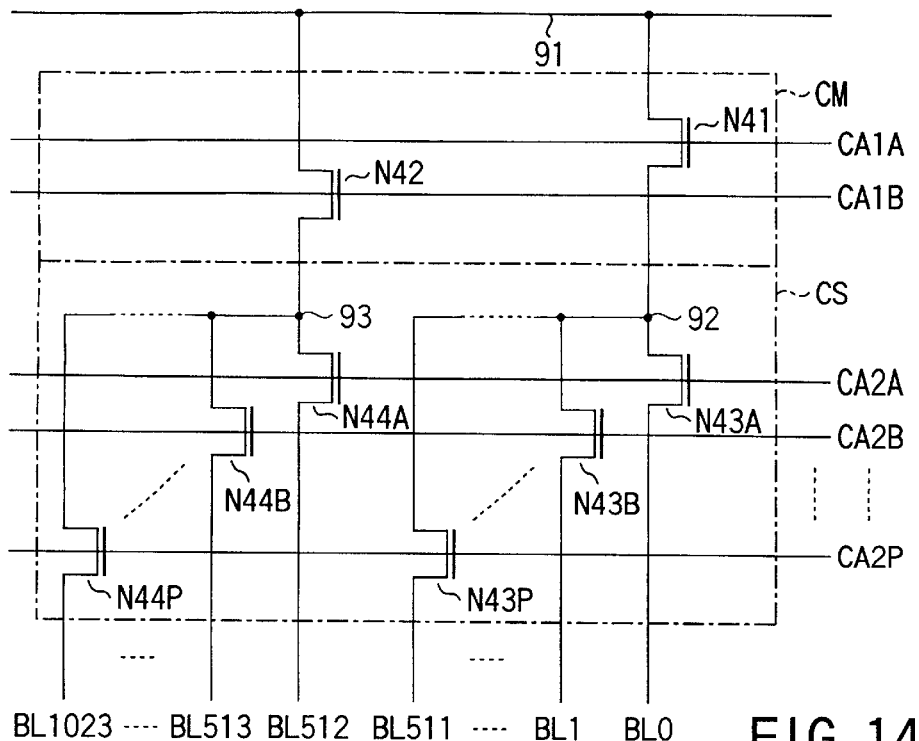
FIG. 14 shows a detailed circuit configuration of the column gate circuit shown in FIG. 3.

FIG. 14 shows a detailed circuit configuration of the column gate circuits (CG) 14A and 14B. This column gate circuit consists of a column main gate circuit CM and a column sub-gate circuit CS.

The column main gate circuit CM consists of an N-transistor N41 and an N-transistor N42. A current path between a source and a drain of a N-transistor N41 is connected between a node 91 and a node 92 in the column sub-gate circuit CS. The node 91 is connected in common to the input node of the sense amplifier (SA) 17 and to the output node of the write buffer (WB) 18. A current path between a source and a drain of a N-transistor N42 is connected between the node 91 and a node 93 in the column sub-gate circuit CS. Further, the gates of both the N-transistors N41 and N42 are supplied with column address signals CA1A and CA1B different from each other, which are generated by the address buffer 19 described previously.

The column sub-gate circuit CS consists of a first group of N-transistors N43A, N43B, . . . N43P and a second group of N-transistors N44A, N44B, . . . N44P. Current paths between sources and drains of the first group of N-transistors N43A, N43B, . . . N43P are respectively connected between the node 92 and bit lines BL0, BL1, . . . BL511. Current paths between sources and drains of the second group of N-transistors N44A, N44B, . . . N44P are respectively connected between the node 93 and bit lines BL512, BL513, . . . BL1023. Further, each of the gates of the N-transistors N43A and N44A connected to the bit lines BL0 and BL512 is supplied with the column address signal CA2A generated by the address buffer (AB) 19 described previously. Each of the gates of the N-transistors N43B and N44B connected to the bit lines BL1 and BL513 is supplied with the column address signal CA2B generated by the address buffer (AB) 19 described previously. In a similar manner, column address signals different from each other are respectively supplied to the gates of every two N-transistors connected to two different bit lines.

Thus, each of the column gate circuits (CG) 14A and 14B is provided with a plurality of transistors, and the plurality of transistors are connected in form of a tree. Further, one of a plurality of bit lines BL0 to BL1023 is selected in correspondence with a column address signal.

Figure 15:
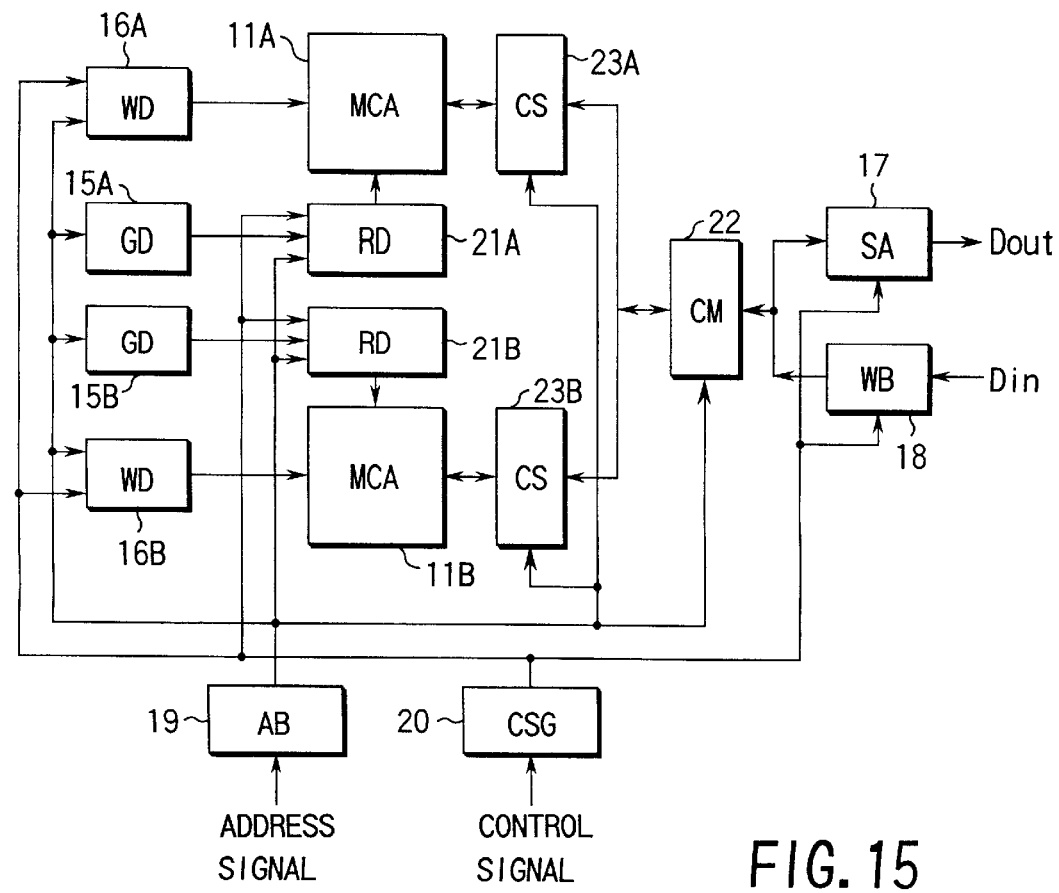
FIG. 15 is a block diagram showing a non-volatile semiconductor memory device according to the second embodiment of the present invention.

Note that the present invention is not limited to the embodiment described above. For example, the memory device shown in FIG. 3 has been explained in the case where the row decoder consists of a row main decoder 12 and two row sub-decoders 13A and 13B. However, as shown in the second embodiment of the present invention in FIG. 15, row decoders (RD) 21A and 21B may be respectively provided for memory cell arrays 11A and 11B, in place of separating the row decoder into a row main decoder and row sub-decoders. Also, in this second embodiment, the column gate circuit consists of a column main gate circuit (CM) and two column sub-gate circuits (CS) 23A and 23B which are respectively provided for the two memory cell arrays 11A and 11B.

As has been explained above, according to the present invention, it is possible to provide a nonvolatile semiconductor memory device in which the reduction rate of the memory cell size can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
    a first semiconductor region having a first conductivity type;
    a memory cell array including a plurality of memory cells arranged in form of a matrix consisting of rows and columns, each of the plurality of memory cells having second and third semiconductor regions as a source and a drain, which are formed in the first semiconductor region and have a second conductivity type opposite to the first conductivity type, and each of the plurality of memory cells including a control gate and a floating gate;
    a plurality of word lines respectively connected in common to the rows of the control gates of the plurality of memory cells arranged in the memory cell array;
    a plurality of bit lines respectively connected in common to the columns of the drains of the plurality of memory cells arranged in the memory cell array;
    a source line connected in common to the sources of the plurality of memory cells and connected to the first semiconductor region; and
    a first voltage output circuit for outputting a first voltage to the source line during operation of erasing data from a memory cell in the memory cell array.

2. The device according to claim 1, further comprising a second voltage output circuit for outputting a second voltage to the plurality of word lines, during the operation of erasing data from a memory cell in th e memory cell array.

3. The device according to claim 2, wherein the second voltage output circuit outputs the second voltage to the word lines, after the first voltage is outputted from the firs t voltage output circuit to the source line and a potential of the source line is stabled, during the operation of erasing data from a memory cell in the memory cell array.

4. The device according to claim 2, wherein the first voltage output circuit stops outputting of the first voltage to the source line, after the second voltage outputted to the word lines from the second voltage output circuit is stopped, during the operation of erasing data from a memory cell in the memory cell array.

5. The device according to claim 1, wherein the first voltage is a voltage having a positive value.

6. The device according to claim 2, wherein the second voltage is a voltage having a negative value.

7. The device according to claim 1, wherein the first semiconductor region is a second well having the first conductivity type which is formed in a first well having the second conductivity type which is formed in the semiconductor substrate having the first conductivity type.

8. The device according to claim 1, wherein the memory cell array includes at least one dummy cell rows respectively provided at peripheral portions in a column direction, each of the dummy cell rows consisting of a plurality of dummy cells each having a source, a drain, a control gate, and a floating gate, and wherein the control gates of the plurality of dummy cells forming each of the dummy cell rows are connected in common with each other, and the control gates of the plurality of dummy cells are connected to the source line.

9. A non-volatile semiconductor memory device comprising:
    a semiconductor substrate;
    a first semiconductor region formed in the substrate and having a first conductivity type;
    a second semiconductor region formed in the substrate to be separate from the first semiconductor region and having the first conductivity type;
    a first memory cell array including a plurality of memory cells each having third and fourth semiconductor regions as a source and a drain, which are formed in the first semiconductor region and have a second conductivity type opposite to the first conductivity type, each of the plurality of memory cells including a control gate and a floating gate, and the plurality of memory cells arranged in form of a matrix consisting of rows and columns;
    a second memory cell array including a plurality of memory cells each having fifth and sixth semiconductor regions as a source and a drain, which are formed in the second semiconductor region and have the second conductivity type opposite to the first conductivity type, each of the plurality of memory cells including a control gate and a floating gate, and the plurality of memory cells arranged in form of a matrix consisting of rows and columns;

a plurality of first word lines respectively connected in common to the rows of the control gates of the plurality of memory cells arranged in the first memory cell array;

a plurality of second word lines respectively connected in common to the rows of the control gates of the plurality of memory cells arranged in the second memory cell array;

a plurality of first bit lines respectively connected in common to the columns of the drains of the plurality of memory cells arranged in the first memory cell array;

a plurality of second bit lines respectively connected in common to the columns of the drains of the plurality of memory cells arranged in the second memory cell array;

a first source line connected in common to the sources of the plurality of memory cells in the first memory cell array and connected to the first semiconductor region;

a second source line connected in common to the sources of the plurality of memory cells in the second memory cell array and connected to the second semiconductor region;

a first voltage output circuit for outputting a first voltage to the first source line during operation of erasing data from a memory cell in the first memory cell array; and a second voltage output circuit for outputting a second voltage which is substantially equal to the first voltage to the second source line during operation of erasing data from a memory cell in the second memory cell array.

10. The device according to claim 9, further comprising:

a third voltage output circuit for outputting a third voltage to the plurality of first word lines during the operation of erasing data from a memory cell in the first memory cell array; and a fourth voltage output circuit for outputting a fourth voltage which is substantially equal to the third voltage to the plurality of second word lines during the operation of erasing data from a memory cell in the second memory cell array.

11. The device according to claim 10, wherein the third voltage output circuit outputs the third voltage to the first word line, after the first voltage is outputted from the first voltage output circuit to the first source line and a potential of the first source line is stabled, during the operation of erasing data from a memory cell in the first memory cell array, and the fourth voltage output circuit outputs the fourth voltage to the second word line, after the second voltage is outputted from the second voltage output circuit to the second source line and a potential of the second source line is stabled, during the operation of erasing data from a memory cell in the second memory cell array.

12. The device according to claim 10, wherein the first voltage output circuit stops outputting of the first voltage to the first source line, after the third voltage outputted to the first word lines from the third voltage output circuit is stopped, during the operation of erasing data from a memory cell in the first memory cell array, and the second voltage output circuit stops outputting of the second voltage to the second source line, after the fourth voltage outputted to the second word lines from the fourth voltage output circuit is stopped, during the operation of erasing data from a memory cell in the second memory cell array.

13. The device according to claim 9, wherein the first voltage is a voltage having a positive value.

14. The device according to claim 10, wherein the third voltage is a voltage having a negative value.

15. The device according to claim 9, wherein the first semiconductor region is a second well having the first conductivity type which is formed in a first well having the second conductivity type which is formed in the semiconductor substrate, and the second semiconductor region is a fourth well having the first conductivity type which is formed in a third well having the second conductivity type which is formed in the semiconductor substrate and separated from the first well.

16. The device according to claim 15, wherein the first well is electrically connected to the second well, and the third well is electrically connected to the fourth well.

17. The device according to claim 9, wherein each of the first and second memory cell arrays includes at least one dummy cell rows respectively provided at peripheral portions in a column direction, each of the dummy cell rows consisting of a plurality of dummy cells each having a source, a drain, a control gate, and a floating gate, and wherein the control gates of the plurality of dummy cells forming each of the dummy cell rows are connected in common with each other, and the control gates of the plurality of dummy cells in the first memory cell array are connected to the first source line, and the control gates of the plurality of dummy cells in the second memory cell array are connected to the second source line.

18. The device according to claim 1, wherein the memory cell array comprises a dummy cell having a source and a control gate, where the control gate of the dummy cell is connected to the source.

19. The device according to claim 9, wherein each of the first and second memory cell arrays comprises a dummy cell having a source and a control gate, where the control gate of the dummy cell is connected to the source.

20. The device according to claim 1, wherein the first voltage output circuit has a plurality of transistors formed in a semiconductor region which differs from the first semiconductor region.

21. The device according to claim 2, where in the second voltage output circuit has a plurality of transistors formed in a semiconductor region which differs from the first semiconductor region.

22. The device according to claim 9, wherein the first voltage output circuit has a plurality of transistors formed in a semiconductor region which differs from the first semiconductor region, and the second voltage output circuit has a plurality of transistors formed in a semiconductor region which differs from the second semiconductor region.

23. The device according to claim 10, wherein the third voltage output circuit has a plurality of transistors formed in a semiconductor region which differs from the first semiconductor region, and the fourth voltage output circuit has a plurality of transistors formed in a semiconductor region which differs from the second semiconductor region.

* * * * *